United States Patent
Yu et al.

(10) Patent No.: US 7,585,738 B2
(45) Date of Patent: Sep. 8, 2009

(54) METHOD OF FORMING A FULLY SILICIDED SEMICONDUCTOR DEVICE WITH INDEPENDENT GATE AND SOURCE/DRAIN DOPING AND RELATED DEVICE

(75) Inventors: Shaofeng Yu, Plano, TX (US); Freidoon Mehrad, Plano, TX (US); Jiong-Ping Lu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/741,540

(22) Filed: Apr. 27, 2007

(65) Prior Publication Data

US 2008/0265420 A1 Oct. 30, 2008

(51) Int. Cl.
H01L 21/336 (2006.01)
H01L 21/44 (2006.01)
(52) U.S. Cl. .............. 438/301; 438/303; 438/655; 438/682; 257/E21.438; 257/E21.619
(58) Field of Classification Search ............... 438/301, 438/303, 655, 682; 257/E21.438, E21.619
See application file for complete search history.

(56) References Cited

U.S. PATENT DOCUMENTS

| | | | |
|---|---|---|---|
| 6,399,469 B1 * | 6/2002 | Yu | 438/595 |
| 6,420,273 B1 * | 7/2002 | Lin | 438/706 |
| 6,620,718 B1 * | 9/2003 | Wieczorek et al. | 438/592 |
| 7,122,410 B2 * | 10/2006 | Kammler et al. | 438/154 |
| 2002/0164846 A1 * | 11/2002 | Lin et al. | 438/197 |
| 2005/0026379 A1 * | 2/2005 | Kammler et al. | 438/303 |
| 2006/0134844 A1 | 6/2006 | Lu et al. | |
| 2007/0210351 A1 * | 9/2007 | Tsuchiya et al. | 257/288 |
| 2008/0045022 A1 * | 2/2008 | Kurihara et al. | 438/694 |
| 2008/0081471 A1 * | 4/2008 | Press et al. | 438/682 |
| 2008/0081486 A1 * | 4/2008 | Schwan et al. | 438/758 |
| 2008/0102586 A1 * | 5/2008 | Park | 438/290 |
| 2009/0032884 A1 * | 2/2009 | Tsuchiya et al. | 257/369 |

OTHER PUBLICATIONS

U.S. Appl. No. 11/694,662, filed Mar. 30, 2007, First named inventor: Manfred Ramin, 36 pages, including 14 pages of drawings.

* cited by examiner

*Primary Examiner*—Ngan Ngo
(74) *Attorney, Agent, or Firm*—Rose Alyssa Keagy; Wade J. Brady, III; Frederick J. Telecky, Jr.

(57) ABSTRACT

A method of forming a fully silicided semiconductor device with independent gate and source/drain doping and related device. At least some of the illustrative embodiments are methods comprising forming a gate stack over a substrate (the gate stack comprising a polysilicon layer and a blocking layer), and performing an ion implantation into an active region of the substrate adjacent to the gate stack (the blocking layer substantially blocks the ion implantation from the polysilicon layer).

13 Claims, 6 Drawing Sheets

US 7,585,738 B2

METHOD OF FORMING A FULLY SILICIDED SEMICONDUCTOR DEVICE WITH INDEPENDENT GATE AND SOURCE/DRAIN DOPING AND RELATED DEVICE

BACKGROUND

In today's electronics industry, devices are continually getting smaller, faster, and using less power, while simultaneously being able to support and perform a greater number of increasingly complex and sophisticated functions. One reason for these trends is an ever increasing demand for small, portable and multifunctional electronic devices. For example, cellular phones, personal computing devices, and personal audio devices (e.g., MP3 players) are in great demand in the consumer market. Such electronic devices rely on a limited power source (e.g., batteries) while providing ever-increasing processing capabilities and storage capacity.

Accordingly, there is a continuing trend in the semiconductor industry to manufacture low-cost, high-performance, and low-power integrated circuits (ICs). These goals have been achieved in great part by scaling down the dimensions of semiconductor ICs and thus increasing device and circuit densities. Achieving higher densities calls for smaller feature sizes, smaller separations between features and layers, and more precise feature shapes. The scaling down of IC dimensions can facilitate faster circuit performance (e.g., faster switching speeds) and can lead to higher effective yield in IC fabrication processes by providing (i.e., "packing") more circuits on a semiconductor die and/or more die on a semiconductor wafer.

A fundamental building block of semiconductor ICs is the metal-oxide semiconductor (MOS) transistor. FIG. 1 illustrates a cross-section of a basic MOS transistor 100. The transistor 100 is fabricated on a semiconductor substrate 110 and comprises a gate stack 120. The gate stack 120 comprises a gate dielectric 130 (e.g., silicon dioxide) and a gate electrode 140 (e.g., polysilicon) on the gate dielectric 130. The transistor 100 also comprises a source region 150 and a drain region 160 each formed within the semiconductor substrate 110. A channel 170 is defined between the source and drain regions 150, 160, under the gate dielectric 130, and within the semiconductor substrate 110. The channel 170 has an associated channel length "L" and an associated channel width "W". When a bias voltage greater than a threshold voltage (Vt) (i.e., turn-on voltage) for the transistor 100 is applied to the gate electrode 140 along with a concurrently applied bias voltage between the source and drain regions 150, 160, an electric current (e.g., a transistor drive current) flows between the source and drain regions 150, 160 through the channel 170. The amount of drive current developed for a given bias voltage (e.g., applied to the gate electrode 140 or between the source and drain regions 150, 160) is a function of, among others, the width-to-length ratio (W/L) of the channel 170.

MOS transistors have become cheaper, faster, and less power-hungry with each new technology generation as the physical dimensions and applied voltages have been scaled down. To date, most transistor scaling has been achieved by thinning the gate dielectric 130 or reducing the channel length "L". However, as transistor scaling moves into the nanometer-scale regime, scaling the gate dielectric 130 thickness or the channel length "L" is not sufficient as new phenomenon appear (e.g., leakage current flowing through the gate dielectric 130, polysilicon gate electrode depletion effects ("poly-depletion"), and contact resistance effects), which reduce the transistor drive current. The poly-depletion effect is characterized by a polysilicon gate electrode 140 that is no longer fully conductive and contributes an additional capacitance (in series) between the gate electrode 140 and the silicon substrate 110, resulting in reduced transistor drive current. New gate dielectrics having a high dielectric constant ("high-K" gate dielectrics) have been introduced in an effort to improve transistor drive current without increasing the leakage current through the gate dielectric 130. However, high-K gate dielectrics face reliability and compatibility issues with polysilicon gate electrodes such as poor work function control, which results in, for example, transistors having an unsuitable threshold voltage (Vt). For other gate dielectric materials such as silicon dioxide, polysilicon gate electrodes become problematic with scaling due to the poly-depletion effect and contact resistance problems.

SUMMARY

The problems noted above are solved in large part by a method of forming a fully silicided semiconductor device with independent gate and source/drain doping and related device. At least some of the illustrative embodiments are methods comprising forming a gate stack over a substrate (the gate stack comprising a polysilicon layer and a blocking layer), and performing an ion implantation into an active region of the substrate adjacent to the gate stack (the blocking layer substantially blocks the ion implantation from the polysilicon layer).

Other illustrative embodiments are semiconductor devices comprising a substrate, a first gate stack on the substrate (the first gate stack having a first height, and the first gate stack comprising a blocking layer substantially impervious to ion implantation), and a spacer along a sidewall of the first gate stack (the spacer having a second height). The first height is substantially equal to the second height.

Yet other illustrative embodiments are semiconductor devices comprising a substrate, a gate stack on the substrate (the gate stack having a first height, and the gate stack comprising a silicide layer), and a spacer along a sidewall of the gate stack (the spacer having a second height). The first height is substantially unequal to the second height.

BRIEF DESCRIPTION OF THE DRAWINGS

For a more detailed description of the various embodiments, reference will now be made to the accompanying drawings, wherein.

NOTATION AND NOMENCLATURE

Figure 1:
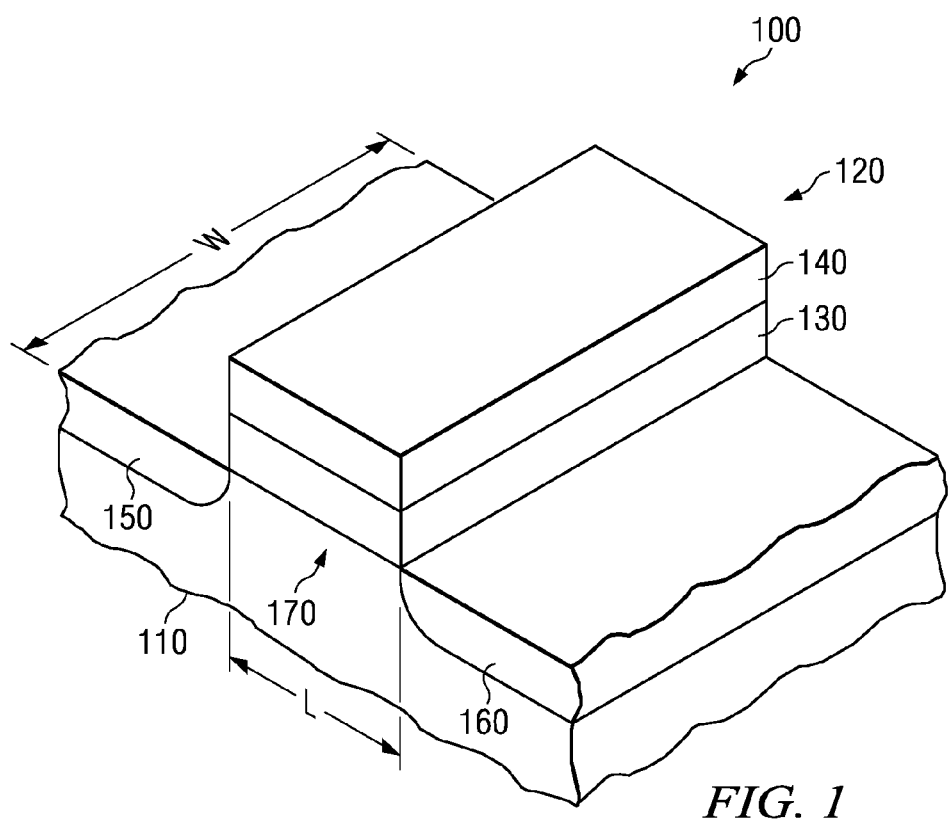
FIG. 1 shows a perspective view of a MOS transistor.

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

A "blocking" layer means a layer that substantially blocks, for example, a dopant species delivered by way of ion implantation. Also, the term "active region" means a region wherein a semiconductor device is formed within and/or on a semiconductor substrate, and wherein the active region does not comprise isolation structures, such as shallow trench isolation (STI) structures or field oxide (FOX) regions.

Unless otherwise stated, when a layer is said to be "deposited over the substrate" or "formed over the substrate", it means that the layer is deposited or formed over any topography that already exists on the substrate.

The term "thermal budget" is used to define an amount of thermal energy transferred to a semiconductor wafer (e.g., during a high-temperature process) and is given as a product of temperature (e.g., in degrees Kelvin) and time (e.g., in seconds). Low thermal budget processes are preferred, for example, to prevent dopant redistribution or electromigration.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment. Also, layers and/or elements depicted herein are illustrated with particular dimensions and/or orientations relative to one another for purposes of simplicity and ease of understanding, and actual dimensions and/or orientations of the layers and/or elements may differ substantially from that illustrated herein.

The subject matter disclosed herein is directed to methods associated with construction of a semiconductor device, such as a metal-oxide semiconductor (MOS) transistor. A semiconductor is a material (e.g., silicon or germanium) having properties somewhere between a conductor and an insulator. By adding impurities (e.g., by a process known as "doping"), a semiconductor can be classified as being electron-rich (N-type, wherein "N" stands for Negative) or electron-poor (P-type, wherein "P" stands for Positive). Through a series of semiconductor processing techniques (e.g., deposition, photolithography, etching, ion implantation), semiconductor materials are used to make semiconductor devices (e.g., transistors) which are in turn used to make integrated circuits (ICs). Moreover, N-type MOS transistors (NMOS) and P-type MOS (PMOS) transistors are often used together to form complementary metal-oxide semiconductor (CMOS) ICs.

Metallic gate electrodes in semiconductor CMOS ICs overcome electrostatic and transport issues (e.g., poly-depletion, threshold voltage control, and contact resistance) associated with polysilicon gate electrodes. In particular, embodiments disclosed herein relate to integrating a metallic gate electrode into a CMOS process flow by way of a fully silicided (FUSI) process flow. Silicidation of a polysilicon gate electrode involves depositing a layer of metal (e.g., Nickel) over the polysilicon gate and performing an anneal to induce a reaction between the metal and the polysilicon gate. During the anneal, a deposited layer of metal may diffuse into the polysilicon gate and react to form a metal silicide (e.g., nickel silicide). In a FUSI process flow, the deposited layer of metal diffuses into, and reacts with, the entire polysilicon gate to form a "fully" silicided metal gate, as opposed to diffusing into, and reacting with, less than the entire polysilicon gate to form a partially silicided metal gate, wherein an unreacted polysilicon layer remains within the gate electrode. In other FUSI process flows, silicon from the polysilicon gate diffuses into the deposited metal layer as opposed to the metal diffusing into the polysilicon gate; however, the result is the same in that a fully silicided metal gate is formed. In some embodiments, a layer of metal is reacted with the source and drain regions of a transistor to form fully silicided source and drain regions, which lessens the contact resistance of the source and drain regions. Prior to the FUSI flow, the polysilicon gate electrode and the source and drain regions are simultaneously doped with a dopant species (e.g., boron for PMOS transistors, and phosphorous or arsenic for NMOS transistors) using a self-aligned ion implantation process. To optimize the work function of the gate electrode during FUSI processing, it is desirable to separate, and independently control, the doping of the gate electrode from the doping of the source and drain regions. Thus, the embodiments described herein provide a method of integrating a FUSI process flow into a CMOS flow while also providing independent control of the doping of the gate electrode and the source and drain regions.

Figure 2:
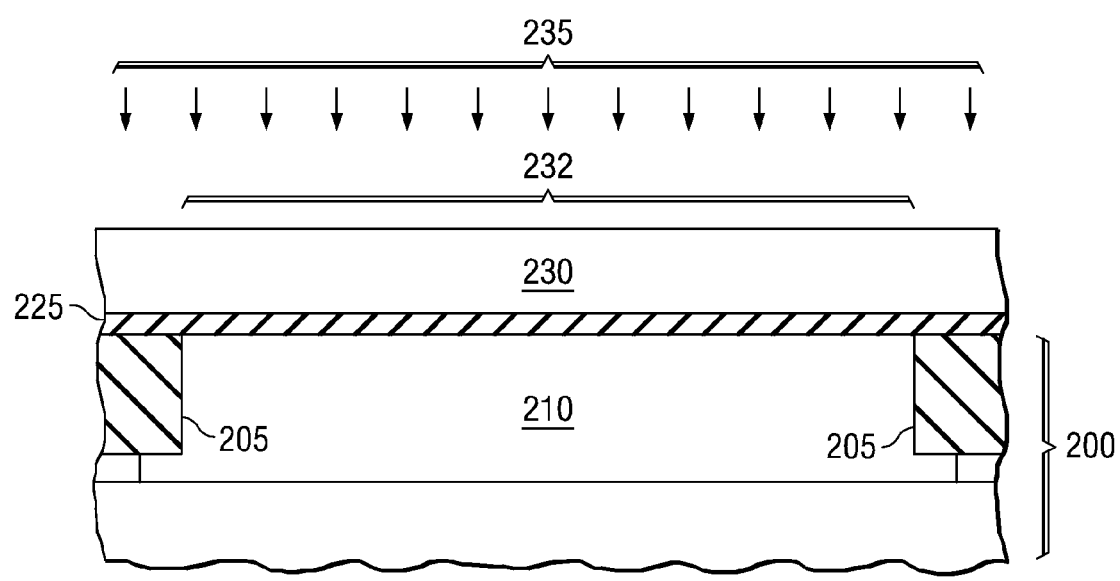
FIG. 2 shows a cross sectional view illustrating the formation of a MOS transistor after formation of a polysilicon layer.

Referring to FIG. 2, isolation structures 205 are formed within a substrate 200 in order to define an active area 232 and to electrically isolate neighboring devices (e.g., transistors) from one another. In some embodiments, the substrate 200 comprises, for example, a P-type single crystal silicon substrate that may be formed, for example, by epitaxial growth. In other embodiments, the substrate 200 comprises for example, a silicon germanium (SiGe) substrate or a silicon-on-insulator (SOI) substrate. The isolation structures 205 can be formed, for example, by a shallow trench isolation (STI) process. A well 210 is then formed within the substrate 200, for example, by performing an ion implantation into the substrate 200 followed by a high-temperature anneal. The well 210 is doped with N-type dopants (e.g., phosphorous or arsenic) or P-type dopants (e.g., boron) depending on the type of transistor (NMOS or PMOS) to be formed within the well 210. A dielectric layer 225 is then formed over the substrate 200. The dielectric layer 225 comprises a non-conductive material (e.g., a silicon oxide (i.e., $SiO_2$), a silicon oxynitride, or a high dielectric constant ("high-K") material such as a hafnium-based metal-oxide or a hafnium-based silicate). Depending on the material used for the dielectric layer 225, the dielectric layer 225 can be formed by a variety of techniques (e.g., thermal oxidation, thermal oxidation followed by a thermal nitridation, atomic layer deposition (ALD), or chemical vapor deposition (CVD)). A polysilicon layer 230 is then formed over the dielectric layer 225. The polysilicon layer 230 is formed, for example, by using a low-pressure chemical vapor deposition (LPCVD) process. During a FUSI process flow (discussed below), the polysilicon layer 230 is reacted with a metal layer to form a fully silicided metal gate electrode (e.g., a nickel silicide gate electrode).

After formation of the polysilicon layer 230, an ion implantation 235 is optionally performed for the purpose of doping the polysilicon layer 230. Depending on the type of transistor being formed (NMOS or PMOS), the ion implantation 235 implants either N-type or P-type dopants. During the FUSI process flow, the fully silicided gate electrode retains the doping introduced during the ion implantation 235 such that the resulting fully silicided gate electrode has a work function and threshold voltage (Vt) determined, at least in part, by the ion implantation 235. In some embodiments, the dopant species of the ion implantation 235 is selected in order to tune the work function of the gate electrode.

Figure 3:
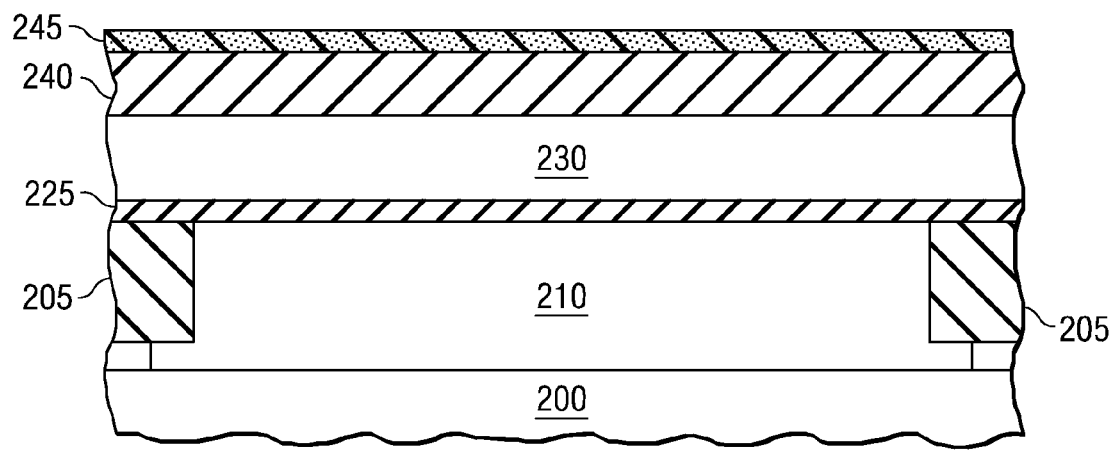
FIG. 3 shows a cross sectional view illustrating the formation of a MOS transistor after formation of a blocking layer.

Referring to FIG. 3, after the ion implantation 235, a blocking layer 240 is formed over the polysilicon layer 230. The blocking layer 240 comprises a nitride layer (e.g., an LPCVD nitride layer or a plasma enhanced chemical vapor deposition (PECVD) nitride layer). In some embodiments, the blocking layer 240 has a thickness of about 200 Angstroms. In the embodiments described herein, the blocking layer 240 blocks subsequent ion implantations (e.g., ion implantations used to form lightly-doped source/drain regions, or to form source/drain regions) from the polysilicon layer 230, and thus allows for the separate and independent doping of the gate electrode (which is formed from the polysilicon layer 230) and the source/drain regions of the transistor. In some embodiments, an antireflective coating (ARC) layer 245 (e.g., an organic or inorganic ARC layer) is formed over the blocking layer 240 for patterning of a gate stack as discussed below. ARC layers are used to suppress reflections from underlying layers during a lithographic process and to improve the quality of a subsequently patterned layer. The ARC layer 245 can be removed after the gate stack has been patterned and formed by an etching process. In some embodiments, the ARC layer 245 is not removed and is used to assist the blocking layer 240 with blocking of subsequent ion implantations. In other embodiments, the blocking layer 240 comprises an ARC layer, and an additional ARC layer (e.g., the ARC layer 245) is not formed over the blocking layer 240.

Figure 4:
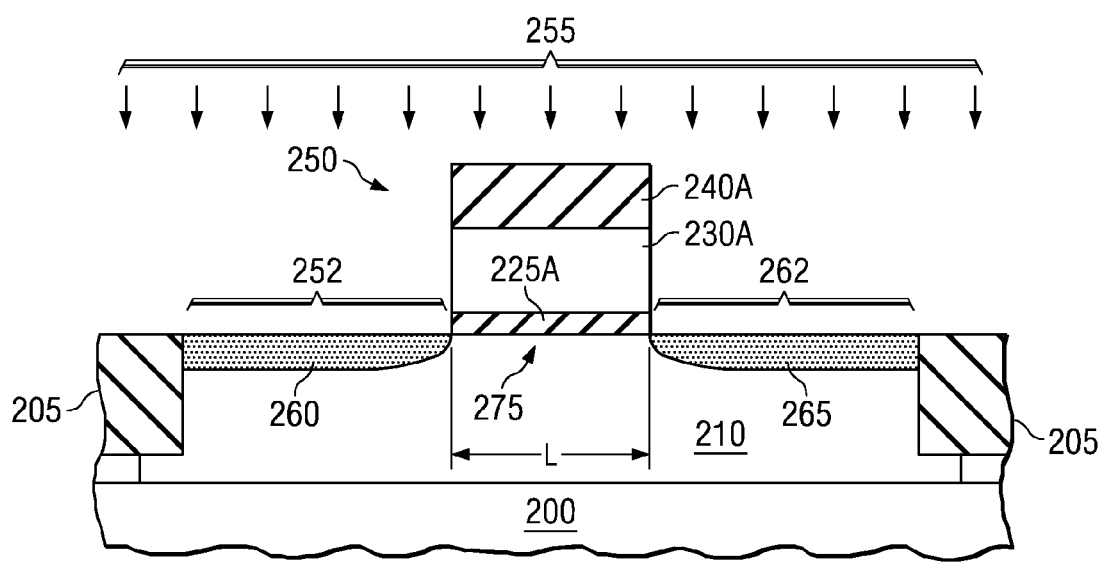
FIG. 4 shows a cross sectional view illustrating the formation of a MOS transistor after formation of a gate stack and source/drain extension regions.

As shown in FIG. 4, the ARC layer 245 has been removed (e.g., by a wet or dry etching process), and the dielectric layer 225, the polysilicon layer 230, and the blocking layer 240 (FIG. 3) have been patterned and etched to form a gate stack 250, wherein the gate stack 250 comprises a dielectric layer 225A, a polysilicon layer 230A, and a blocking layer 240A. The patterning process can be performed in any suitable manner, such as with lithographic techniques where lithography broadly refers to processes for transferring one or more patterns between various media. In photolithography, a light sensitive layer (e.g., photoresist) is formed upon a layer (e.g., by spin-coating) to which a pattern is to be transferred. The light sensitive layer is then patterned by exposing it to one or more types of radiation or light which selectively pass through an intervening mask which comprises a pattern defined by various transparent and opaque regions. The light causes exposed or unexposed regions of the light sensitive layer to become more or less soluble, depending on the type of light sensitive layer used. A developer (i.e., an etchant) is then used to remove the more soluble areas, thereby transferring the mask pattern to the light sensitive layer. The patterned light sensitive layer can then serve as a mask for an underlying layer or layers, wherein the underlying layer or layers can be etched to form the pattern as defined by the light sensitive layer. In particular, the dielectric layer 225, the polysilicon layer 230, and the blocking layer 240 (FIG. 3) are patterned simultaneously by way of the light sensitive layer, and various (dry or wet) etchants can be used to remove each of the layers in sequence, using the patterned light sensitive layer as a mask. After etching of the dielectric layer 225, the polysilicon layer 230, and the blocking layer 240 (FIG. 3) to form the gate stack 250, the light sensitive layer is stripped by an "ashing" process, wherein for example, the light sensitive layer is removed by exposure to an oxygen ambient at a high-temperature in the presence of radio frequency (RF) power.

After forming the gate stack 250 and stripping the light sensitive layer, an ion implantation 255 is performed. In particular, the ion implantation 255 is performed into an active region 252 and into an active region 262 in order to define a lightly doped source region 260 and a lightly doped drain region 265. The gate stack 250 is also simultaneously subjected to the ion implantation 255; however, the gate stack 250 masks the substrate 200 from the ion implantation 255, such that the lightly doped source and drain regions 260, 265 are formed within the substrate 200 immediately adjacent to the gate stack 250. Moreover, the blocking layer 240A blocks the ion implantation 255 from the polysilicon layer 230A such that the doping of the polysilicon layer 230A (i.e., the gate electrode) remains separate and independent of the doping of the lightly doped source and drain regions 260, 265. In some embodiments, a thin conformal oxide or nitride layer may be deposited over the gate stack 250 prior to the ion implantation 255 in order to protect sidewalls of the gate stack 250. Moreover, the thin conformal oxide or nitride layer can be used to protect sidewalls of the polysilicon layer 230A. In some embodiments, the lightly doped source and drain regions 260, 265 may be equivalently referred to as source and drain extension regions. A channel 275 is defined between the lightly doped source region 260 and the lightly doped drain region 265, under the gate dielectric 225A, and within the substrate 200. The channel 275 has an associated channel length "L" and an associated channel width "W". In some embodiments, a thermal process, such as a rapid thermal anneal, is performed to activate the dopants within the lightly doped source and drain regions 260, 265, which may cause a slight lateral diffusion of the lightly doped source and drain regions 260, 265 under the gate stack 250.

Figure 5:
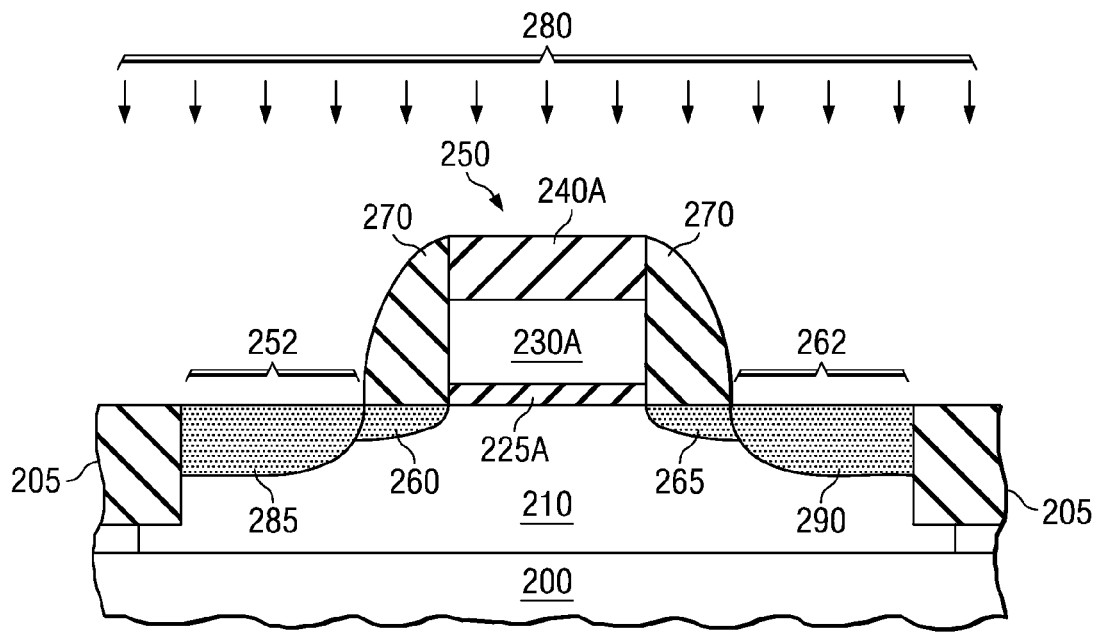
FIG. 5 shows a cross sectional view illustrating the formation of a MOS transistor after formation of source and drain regions.

Referring now to FIG. 5, a spacer 270 is then formed on each sidewall of the gate stack 250. Each spacer 270 comprises an insulating material such as an oxide and/or nitride based material. In some embodiments, the spacers 270 comprise a bistertiary-butylaminosilane (BTBAS) silicon nitride layer. The spacers 270 are formed by depositing one or more layers of such material(s) over the substrate 200 in a conformal manner, followed by an anisotropic etch thereof, thereby removing spacer material from the top of the gate stack 250 and the substrate 200, while leaving the spacers 270 on each of the sidewalls of the gate stack 250. Thereafter, an ion implantation 280 is performed. In particular, the ion implantation 280 is performed into the exposed portion of the active region 252 and into the exposed portion of the active region 262 in order to define a source region 285 and a drain region 290. The gate stack 250 and spacers 270 are also simultaneously subjected to the ion implantation 280; however, the gate stack 250 and spacers 270 mask the substrate 200 from the ion implantation 280, such that the source and drain regions 285, 290 are formed within the substrate 200 immediately adjacent to the spacers 270. Moreover, the blocking layer 240A blocks the ion implantation 280 from the polysilicon layer 230A such that the doping of the polysilicon layer 230A (i.e., the gate electrode) remains separate and independent of the doping of the source and drain regions 285, 290. In addition, the spacers 270 serve to protect the sidewalls of the gate stack 250. In particular, the spacers 270 protect the sidewalls of the polysilicon layer 230A. In some embodiments, a thermal process, such as a rapid thermal anneal, is performed to activate the dopants within the source and drain regions 285, 290, which may cause a slight lateral diffusion of the source and drain regions 285, 290 under the spacers 270.

Figure 6:
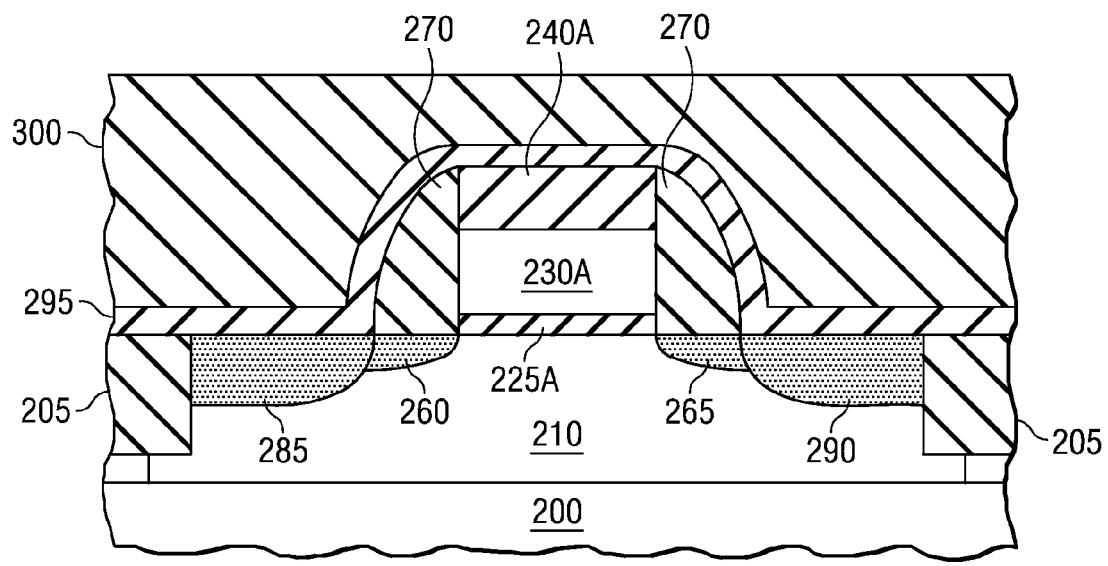
FIG. 6 shows a cross sectional view illustrating the formation of a MOS transistor after formation of a cover layer.

As shown in FIG. 6, once the source and drain regions 285, 290 have been formed, a cover layer 295 is formed over the substrate 200 in a conformal manner. In some embodiments, the cover layer 295 comprises a nitride layer such as a BTBAS silicon nitride layer and has a thickness of about 50-100 Angstroms. An oxide layer 300 is then formed over the cover layer 295. The oxide layer 300 may comprise, for example, a layer of tetraethyl orthosilicate (TEOS), wherein the oxide layer 300 is used, at least in part, to form a planarized layer over the substrate 200. In some embodiments, the oxide layer 300 has a thickness of about 2000 Angstroms. In particular, the planarization of the oxide layer 300 is performed by way of a chemical mechanical polishing (CMP) process, whereby the oxide layer 300 is mechanically polished by a polishing pad while a chemical slurry containing abrasives chemically reacts with the oxide layer 300 to increase the removal rate of the oxide layer 300. Planarization by way of a CMP process is used, for example, to bring an entire topography within a depth of field (DOF) of a given photolithography system.

Figure 7:
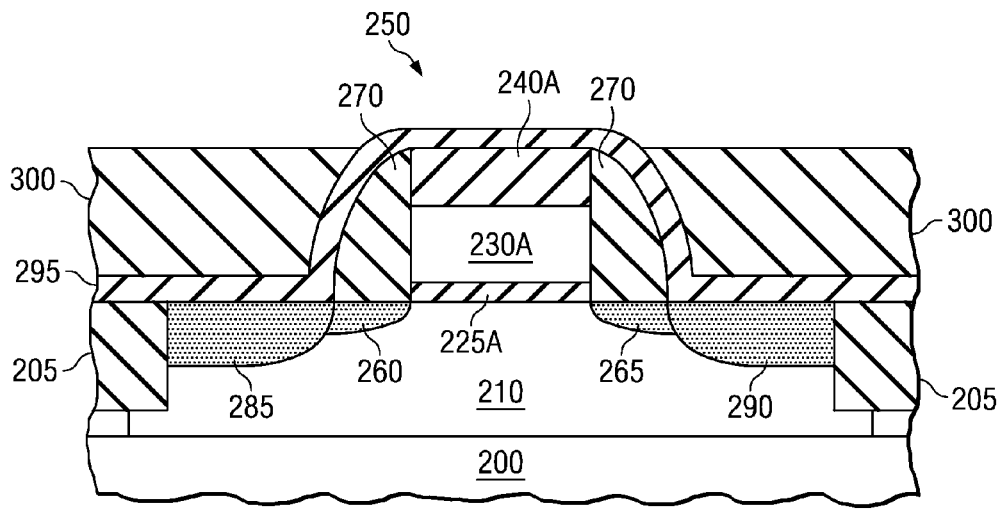
FIG. 7 shows a cross sectional view illustrating the formation of a MOS transistor after a chemical mechanical polishing (CMP) process.
Figure 8:
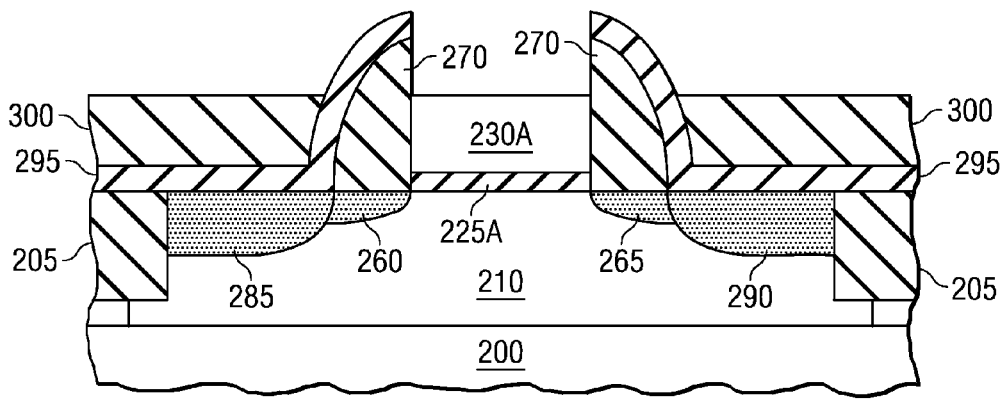
FIG. 8 shows a cross sectional view illustrating the formation of a MOS transistor after removal of the blocking layer.

As shown in FIG. 7, the oxide layer 300 is polished (e.g., by way of a CMP process), until the cover layer 295 is exposed over the gate stack 250. In some embodiments, the cover layer 295 may also be exposed over the spacers 270. The cover layer 295 serves as a landing pad for the CMP process (i.e., as a CMP stopping layer) and as protection for the source and drain regions 285, 290 during silicidation of the polysilicon layer 230A (discussed below). The exposed cover layer 295 and the blocking layer 240A are then removed, as shown in FIG. 8. For example, in some embodiments, removal is accomplished by a dry etch comprising a reactive ion etch (RIE) (for removal of the cover layer 295) and a wet etch comprising a hot phosphoric acid (for removal of the blocking layer 240A). An acid (e.g., hydrofluoric acid (HF)) is then used to etch (i.e., to clean) the top of the exposed polysilicon layer 230A so that the subsequently formed silicide layer will be of a high quality. During the acid etch or clean of the exposed polysilicon layer 230A, a portion of the oxide layer 300 may be removed. However, the cover layer 295 is not effectively etched by the illustrative HF, and thus the cover layer 295 remains as protection for the source and drain regions 285, 290 during subsequent silicidation of the polysilicon layer 230A.

Figure 9:
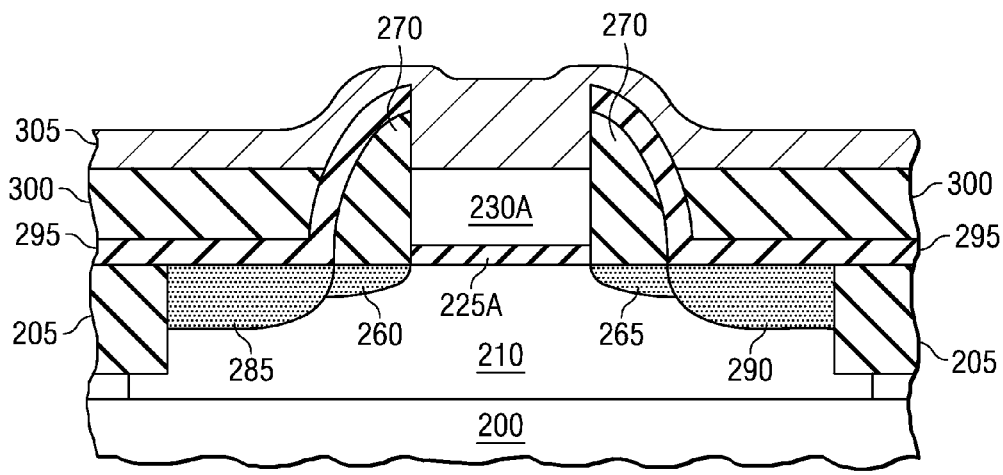
FIG. 9 shows a cross sectional view illustrating the formation of a MOS transistor after formation of a metal layer as a precursor to silicidation of the polysilicon layer.
Figure 10:
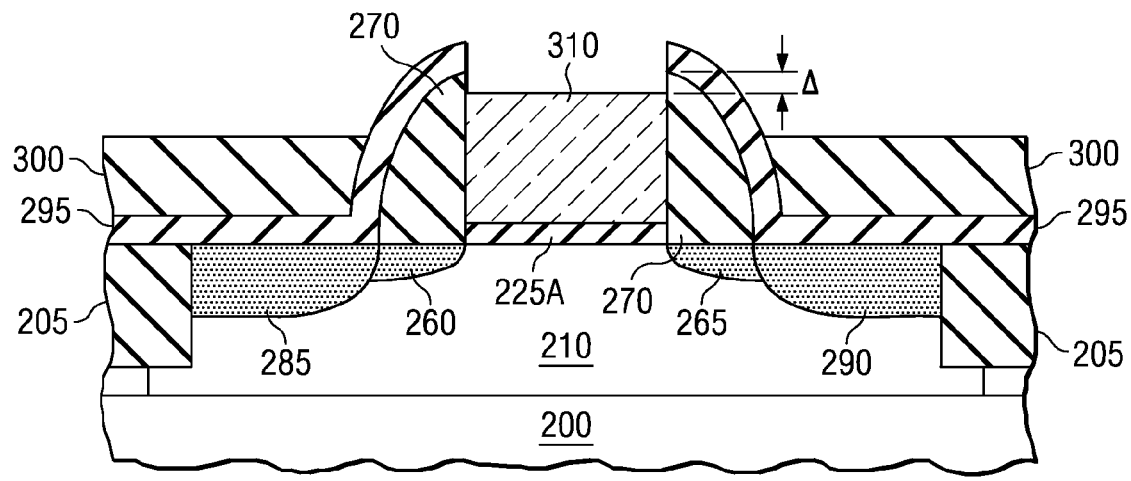
FIG. 10 shows a cross sectional view illustrating the formation of a MOS transistor after silicidation of the polysilicon layer.

In FIG. 9, a metal layer 305 (e.g., nickel) is formed over the substrate 200 as a precursor to silicidation of the polysilicon layer 230A. In some embodiments, the metal layer 305 is formed by a physical method, such as evaporation or sputtering. After formation of the metal layer 305, an anneal is performed to induce a reaction between the metal layer 305 and the polysilicon layer 230A. As shown in FIG. 10, the reaction between the metal layer 305 and the polysilicon layer 230A creates a silicide layer 310 (e.g., a nickel silicide (NiSi) layer) which is now the transistor gate electrode. In particular, metal from the metal layer 305 reacts with the entire polysilicon layer 230A to form a fully silicided metal gate. Unreacted metal is then removed, for example, by way of a wet chemical etch. The source and drain regions 285, 290 remain protected from the silicidation process by the cover layer 295. In addition, the thermal budget used to induce the reaction between the metal layer 305 and the polysilicon layer 230A is low as compared to, for example, the thermal budget used for activation of the source and drain regions 285, 290. Therefore, the FUSI process can be performed after higher thermal budget processing is complete. In some embodiments, after the silicide layer 310 is formed, another anneal may be performed in order to change the phase of the silicide layer 310 into a low-resistance phase. In yet other embodiments, the thermal budget used to induce the reaction between the metal layer 305 and the polysilicon layer 230A can be varied in order to form a silicide layer 310 having one of a plurality of phases, wherein the phase of the silicide layer determines, at least in part, the work function of the silicide layer 310. FIG. 10 also illustrates that there is a net volume expansion of the polysilicon layer 230A (FIG. 9) upon silicidation; however, in some embodiments, there remains a distance Δ between the top of the silicide layer 310 and the top of the spacers 270. The distance Δ may be observed, for example, by way of a cross-section transmission electron microscope (TEM) image of the device.

Figure 11:
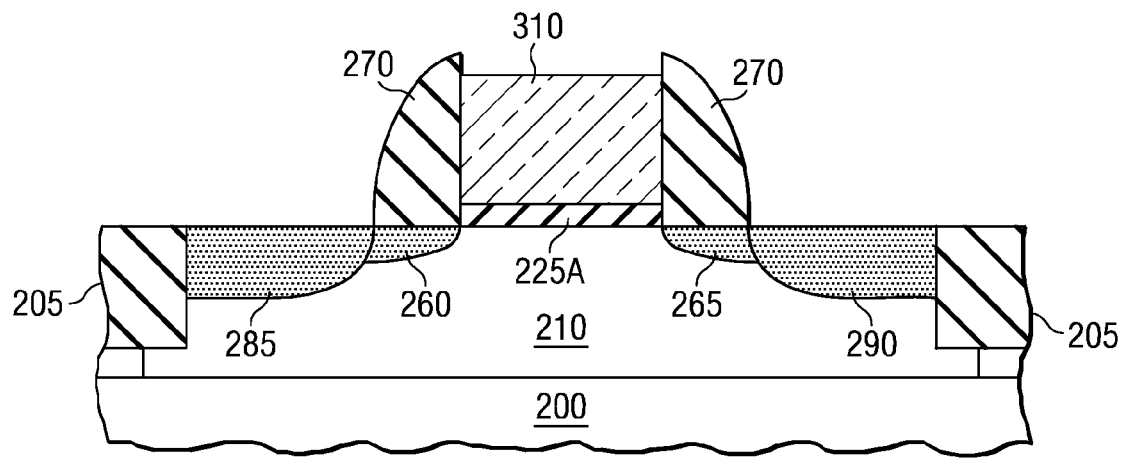
FIG. 11 shows a cross sectional view illustrating the formation of a MOS transistor after removal of the cover layer.
Figure 12:
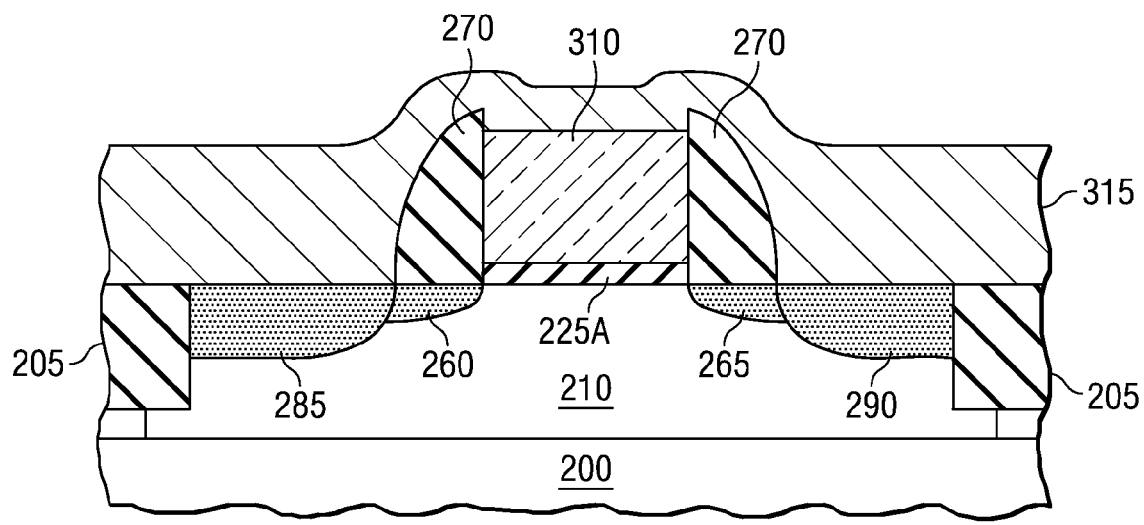
FIG. 12 shows a cross sectional view illustrating the formation of a MOS transistor after formation of a metal layer as a precursor to silicidation of the source and drain regions.
Figure 13:
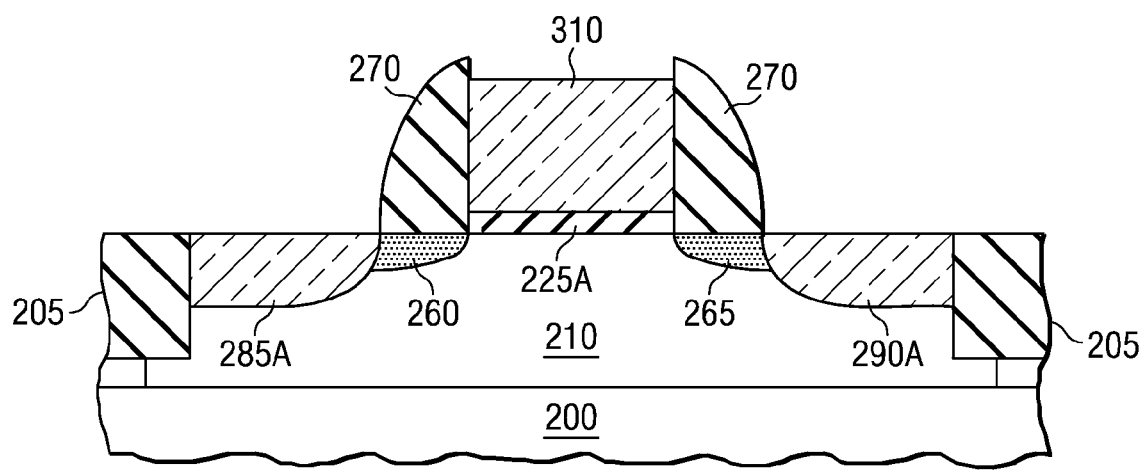
FIG. 13 shows a cross sectional view illustrating the formation of a MOS transistor after silicidation of the source and drain regions.

After formation of the silicide layer 310, any of the remaining oxide layer 300 can be removed (e.g., with an HF etch), and the cover layer 295 is removed (e.g., by way of a dry etch) resulting in a cross-section as shown in FIG. 11. FIG. 12 illustrates that a metal layer 315 (e.g., nickel) is formed over the substrate 200 in order to perform a silicidation of the source and drain regions 285, 290. The metal layer 315 may be formed by a physical method, and an anneal performed to induce a reaction between the metal layer 315 and the source and drain regions 285, 290. As shown in FIG. 13, silicided source and drain regions 285A, 290A, which comprise, for example, nickel silicide (NiSi) regions are then formed. Unreacted metal is then removed. Since the gate electrode (i.e., silicide layer 310) has already been fully silicided, silicidation of the source and drain regions does not affect the silicide layer 310. Thereafter, other CMOS processing may follow (e.g., interlayer dielectric and metallization layers can be formed).

The above discussion is meant to be illustrative of the principles and various embodiments of the present invention. Numerous variations and modifications will become apparent to those skilled in the art once the above disclosure is fully appreciated. For example, unless otherwise indicated, any one or more of the layers set forth herein can be formed in any number of suitable ways (e.g., with spin-on techniques, sputtering techniques (e.g., magnetron and/or ion beam sputtering), thermal growth techniques, deposition techniques such as chemical vapor deposition (CVD), physical vapor deposition (PVD) and/or plasma enhanced chemical vapor deposition (PECVD), or atomic layer deposition (ALD)). Also, unless otherwise indicated, any one or more of the layers can be patterned in any suitable manner (e.g., via lithographic and/or etching techniques). It is intended that the following claims be interpreted to embrace all such variations and modifications.

What is claimed is:

1. A method comprising:
   forming a gate stack over a substrate, the gate stack comprising a polysilicon layer and a blocking layer;
   performing an ion implantation into an active region of the substrate adjacent to the gate stack, wherein the blocking layer substantially blocks the ion implantation into the polysilicon layer;
   performing a full gate silicidation of the polysilicon layer while protecting the active region from the full gate silicidation with a cover layer;
   removing the cover layer over the active region after the full gate silicidation; and
   performing a silicidation of the active region after removing the cover layer over the active region.

2. The method according to claim 1 wherein forming the gate stack further comprises:
   forming a dielectric layer over the substrate;
   forming the polysilicon layer over the dielectric layer; and
   forming the blocking layer over the polysilicon layer.

3. The method according to claim 2 further comprising, prior to forming the blocking layer, performing an ion implantation into the polysilicon layer.

4. The method according to claim 1 further comprising forming a spacer along a sidewall of the gate stack.

5. The method according to claim 1, before the step of performing the full gate silicidation, further comprising:
   forming the cover layer over the substrate;
   forming an oxide layer over the cover layer; and
   performing a chemical mechanical polishing of the oxide layer, the chemical mechanical polishing exposes the cover layer in a region over the gate stack.

6. The method according to claim 5 further comprising removing the cover layer and the blocking layer in the region over the gate stack.

7. The method according to claim 6 wherein removing the cover layer and the blocking layer in the region over the gate stack comprises etching, the etching comprises one or more selected from the group consisting of: dry etching and wet etching.

8. The method according to claim 1 wherein performing the full gate silicidation of the polysilicon layer comprises:
   forming a metal layer over the substrate;
   annealing to induce a reaction between the polysilicon layer and the metal layer; and
   removing unreacted metal of the metal layer.

9. The method according to claim 1 wherein removing the cover layer over the active region comprises etching, the etching comprises one or more selected from the group consisting of: dry etching and wet etching.

10. The method according to claim 5 wherein forming the cover layer further comprises forming the cover layer having a thickness of about 50-100 Angstroms.

11. The method according to claim 1 wherein performing the silicidation of the active region comprises:
    forming a metal layer over the substrate;
    annealing to induce a reaction between the active region and the metal layer; and
    removing unreacted metal of the metal layer.

12. The method according to claim 1 wherein forming the gate stack includes the blocking layer having a thickness of about 200 Angstroms.

13. The method according to claim 1 wherein forming the gate stack further comprises forming an antireflective layer over the blocking layer.

* * * * *